United States Patent
Troia

(10) Patent No.: US 10,836,400 B2
(45) Date of Patent: Nov. 17, 2020

(54) IMPLEMENTING SAFETY MEASURES IN APPLICATIONS

(71) Applicant: Micron Technology, Inc., Boise, ID (US)

(72) Inventor: Alberto Troia, Munich (DE)

(73) Assignee: Micron Technology, Inc., Boise, ID (US)

( * ) Notice: Subject to any disclaimer, the term of this patent is extended or adjusted under 35 U.S.C. 154(b) by 336 days.

(21) Appl. No.: 15/847,201

(22) Filed: Dec. 19, 2017

(65) Prior Publication Data
US 2019/0185017 A1   Jun. 20, 2019

(51) Int. Cl.
*B60W 50/00*   (2006.01)
*G06F 3/06*   (2006.01)

(52) U.S. Cl.
CPC ......... *B60W 50/0098* (2013.01); *G06F 3/065* (2013.01); *G06F 3/0619* (2013.01); *G06F 3/0679* (2013.01); *B60W 2050/0005* (2013.01)

(58) Field of Classification Search
CPC combination set(s) only.
See application file for complete search history.

(56) References Cited

U.S. PATENT DOCUMENTS

| | | | |
|---|---|---|---|
| 7,697,360 B2* | 4/2010 | Dono | G11C 11/40611 365/222 |
| 7,899,610 B2 | 3/2011 | McClellan | |
| 8,126,642 B2 | 2/2012 | Trepagnier et al. | |
| 9,331,989 B2 | 5/2016 | Dover | |
| 9,569,622 B2 | 2/2017 | Dover | |
| 9,613,214 B2 | 4/2017 | Dover | |
| 2004/0136238 A1* | 7/2004 | Wuidart | G11C 11/5692 365/185.05 |
| 2004/0264259 A1* | 12/2004 | Hayashi | G11C 29/24 365/189.05 |
| 2005/0076274 A1* | 4/2005 | Nagai | G06F 11/1008 714/718 |
| 2013/0170304 A1 | 7/2013 | Mochizuki | |
| 2015/0006994 A1* | 1/2015 | Kim | G06F 11/1076 714/763 |
| 2015/0074489 A1* | 3/2015 | Kashiwagi | G11C 7/10 714/763 |
| 2015/0331422 A1* | 11/2015 | Hartung | G05D 1/021 701/23 |
| 2017/0052840 A1* | 2/2017 | Kim | G11C 29/50016 |
| 2017/0068583 A1 | 3/2017 | Park et al. | |
| 2017/0195459 A1 | 7/2017 | Costa et al. | |

(Continued)

OTHER PUBLICATIONS

International Search Report and Written Opinion from related international application No. PCT/US2018/065108, dated Apr. 19, 2019, 13 pp.

*Primary Examiner* — Rami Khatib
(74) *Attorney, Agent, or Firm* — Brooks, Cameron & Huebsch, PLLC

(57) ABSTRACT

An example apparatus comprises a memory resource configured to store data and transmit data. The apparatus may further include a safety controller coupled to the memory resource configured to receive the data from the memory resource, receive latched data from an application controller, and determine whether to allow an output of commands from the application controller in response to a comparison of the data from the memory resource and the latched data from the application controller.

25 Claims, 2 Drawing Sheets

(56) References Cited

U.S. PATENT DOCUMENTS

| | | |
|---|---|---|
| 2017/0214744 A1 | 7/2017 | Neves et al. |
| 2017/0285938 A1* | 10/2017 | Lee .......................... G06F 3/061 |
| 2017/0346542 A1 | 11/2017 | Neves et al. |
| 2017/0352202 A1 | 12/2017 | Matos et al. |
| 2017/0358204 A1 | 12/2017 | Modica et al. |
| 2018/0075884 A1* | 3/2018 | Choi ..................... G06F 3/0659 |
| 2018/0203616 A1* | 7/2018 | Kwon ................... G06F 3/0616 |
| 2019/0364235 A1* | 11/2019 | Honda ................... H04N 5/379 |

* cited by examiner

IMPLEMENTING SAFETY MEASURES IN APPLICATIONS

TECHNICAL FIELD

The present disclosure relates generally to semiconductor memory and methods, and more particularly, to apparatuses and methods related to a safety controller.

BACKGROUND

In conventional motor vehicles (e.g., automobiles, cars, trucks, buses, etc.), the driver is critical to operating the vehicle's control system. For example, the driver of a conventional motor vehicle makes decisions regarding the safe operation of the vehicle. Such decisions may include decisions related to the speed of the vehicle, steering of the vehicle, obstacle and/or hazard recognition, and obstacle and/or hazard avoidance. However, a driver's ability to make these decisions and operate the vehicle's control system may be limited in some situations. For example, driver impairment, fatigue, attentiveness, and/or other factors such as visibility (e.g., due to weather or changes in terrain) may limit a driver's ability to safely operate a conventional motor vehicle and/or its control system.

In order to alleviate the deficiencies resulting from driver operation of a conventional motor vehicle, various manufacturers have experimented with autonomous vehicles. While autonomous vehicles may allow for a reduction in issues that may arise as a result of the driver's ability to operate the conventional motor vehicle becoming lessened, autonomous vehicles have their own shortcomings.

For example, autonomous vehicles may rely on various sensors and/or cameras to determine a speed at which to operate the vehicle, steering of the vehicle, obstacle and/or hazard recognition, and obstacle and/or hazard avoidance. Data from these sensors and/or devices may be corrupted while being stored on memory or transmitted on a memory bus, for example. Data may be corrupted by errors induced by noise, cross talk, and/or other sources of errors. A host may receive commands to safely operate the autonomous vehicle and provide updates to the autonomous vehicle based on data. If the data the commands are based on is corrupted the autonomous vehicle may cease to operate or, in worse case scenarios, fail to provide adequate obstacle and/or hazard recognition, and obstacle and/or hazard avoidance, which may result in injury or death to passengers in the autonomous vehicle.

DETAILED DESCRIPTION

Figure 1:
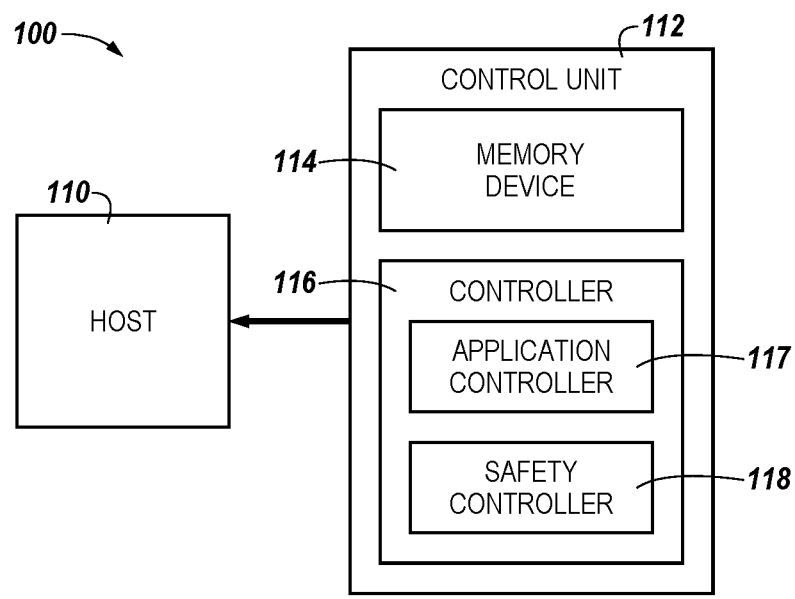
FIG. 1 is a block diagram of a system in the form of a host and a memory device in accordance with a number of embodiments of the present disclosure.

The present disclosure includes apparatuses and methods related to a safety controller. An example apparatus comprises a memory resource configured to store data and transmit data. The apparatus may further include a safety controller coupled to the memory resource configured to receive the data from the memory resource, receive latched data from an application controller, and determine whether to allow an output of a command and/or commands from the application controller in response to a comparison of the data from the memory resource and the latched data from the application controller.

In some approaches, autonomous vehicles may include a memory device to provide data to a controller. The data can include vehicle sensor data, for example obstacle and/or hazard information. The memory can store critical code including firmware, software, and/or temporary calculations derived from the data.

To reduce the probability of the autonomous vehicle executing the wrong code, multiple entities (e.g., a memory device and/or controller) can execute and identify a correct output, which can be referred to as redundancy. Embodiments can be implemented to provide safety measures in applications (e.g., autonomous driving applications in vehicles). As an example, triple redundancy can include two entities transmitting the same code. A third entity can receive the codes and identify whether one or more of the codes are corrupted.

In some embodiments, redundancy can allow a system to avoid failure and/or an accident in the field. For example, redundancy can ensure the correctness of a data transmission between a memory device and a controller. Redundancy can also ensure the correctness of the execution by the controller of the proper code.

For example, because operation of the control system in an autonomous vehicle may be wholly or partly handled by control circuitry, autonomous vehicles may be susceptible to data corruption. Data can be corrupted by noise, cross talk, and/or other sources of error. Redundancy prevents a command, for example, "activate brakes" from being sent when the command is based on corrupt data.

The figures herein follow a numbering convention in which the first digit or digits correspond to the drawing figure number and the remaining digits identify an element or component in the drawing. Similar elements or components between different figures may be identified by the use of similar digits. For example, 114 may reference element "14" in FIG. 1, and a similar element may be referenced as 214 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of a system 100 in the form of a host 110 and a control unit 112 in accordance with a number of embodiments of the present disclosure. As used herein, a memory device 114, a controller 116, an application controller 117, and/or a safety controller 118 might also be separately considered an "apparatus."

As shown in FIG. 1, apparatus 100 includes a host 110 and a control unit 112. The control unit 112 can include a memory resource (e.g., memory device 114) and a controller 116. The controller 116 can include an application controller 117 and a safety controller 118.

The memory device 114 may include volatile and/or non-volatile memory configured to store instructions executable by the controller 116. For example, the memory device 114 may include flash memory, for example NOR, read-only memory (ROM), programmable read-only memory (PROM), erasable programmable read-only memory (EPROM), electrically erasable programmable read-only memory (EEPROM), dynamic random-access memory (DRAM), static random-access memory (SRAM), and/or other suitable storage media. In some embodiments, the memory device 114 can be a double edge device.

The apparatus 100 may be used in autonomous driving applications. For example, the control unit 112 can be located on a vehicle. The memory device 114 of the control unit 112 may store autonomous vehicle data. For example, critical code (e.g., firmware, specific parameters, and data) for an autonomous driving application. The data can include data collected from vehicle sensors, photographic data collected from vehicle cameras, and/or a combination thereof. In some embodiments the memory device 114 can store data and transmit data. The data can be transmitted to the controller 116 including the application controller 117 and the safety controller 118.

The application controller 117 can receive data from the memory device 114. The received data can be used by the application controller 117 to generate commands. For example, the data can include information regarding a vehicle approaching a stop sign. The application controller 117 can generate a command to stop the car. The application can then send the generated command and/or commands to be executed by the vehicle.

In some embodiments, data can be transmitted to the safety controller 118. The safety controller 118 can receive data from the memory device 114 and the application controller 117. The safety controller 118 can prevent a command and/or commands from being executed by the vehicle in response to comparing the data from the memory device 114 and the data from the application controller 117.

Figure 2:
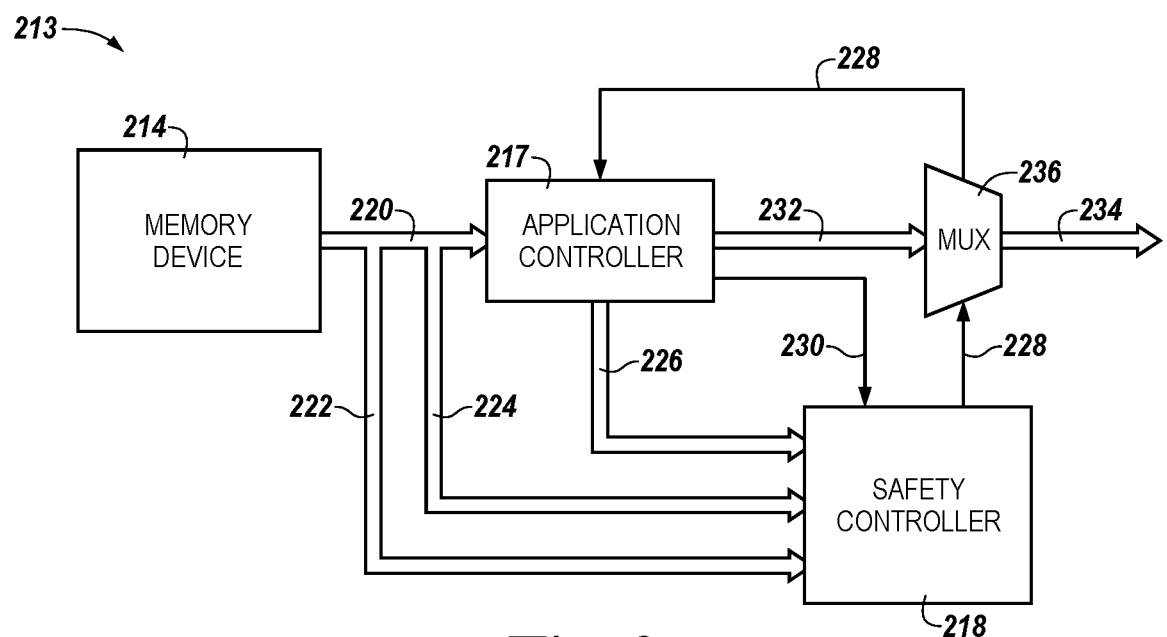
FIG. 2 is a flow diagram associated with triple redundancy in an autonomous driving application in accordance with a number of embodiments of the present disclosure.

FIG. 2 is a flow diagram 213 associated with triple redundancy in an autonomous driving application in accordance with a number of embodiments of the present disclosure. As shown in FIG. 2, the memory device 214, application controller 217, and the safety controller 218 may be configured to exchange data and/or communications. The memory device 214 may transmit data to the safety controller 218 via data paths 222 and 224. The memory device 214 may transmit data to the application controller 217 via data path 220. The application controller 217 may transmit data to the safety controller 218 via data path 226. The application controller 217 can communicate with safety controller 218 via communication path 230. The safety controller 218 can communicate with the application controller 217 and the multiplexer 236 (e.g., MUX) via communication path 228.

In some embodiments, the memory device 214 may store and transmit data. The safety controller 218 can be coupled to the memory device 214 via the data paths 222 and 224. The safety controller 218 can be configured to receive the data from the memory device 214. The data from the memory device 214 can be received by the safety controller 218 as a reverse output via data path 222 and as a direct output via data path 224. The reverse output of the data can be transmitted by the memory device 214 on a falling edge of a clock and the direct output of the data can be transmitted by the memory device 214 on a rising edge of the clock, as further discussed in FIG. 3.

The memory device 214 may transmit data to the application controller 217. The application controller 217 can be coupled to the memory device 214 via the data path 220. The application controller 217 can be configured to receive the data from the memory device 214. The data from the memory device 214 can be received as a direct output by the application controller 217 via data path 220. The direct output of the data can be transmitted by the memory device 214 on a rising edge of a clock, as further discussed in FIG. 3.

In some embodiments, the application controller 217 may latch the data in response to receiving the data from the memory device 214. The application controller 217 can transmit the latched data to the safety controller 218. The application controller 217 can latch the data on a rising edge of the clock. The safety controller 218 can be configured to receive latched data from the application controller 217. The latched data from the application controller 217 can be received by the safety controller 218 as an output via data path 226. The output of the latched data can be transmitted by the application controller 217 on a falling edge of a clock, as further discussed in FIG. 3.

The safety controller 218 can generate a response and/or determine whether to allow an output of commands via data path 232 from the application controller 217 in response to a comparison of the data from the memory device 214 and the latched data from the application controller 217. The data received by the application controller 217 from the memory device 214 can be used to generate commands. The commands can be associated with the data from the memory device 214 and can be output from the application controller 217 in response to the application controller 217 receiving the data from the memory device 214. For example, the data can include information regarding a higher speed limit. The application controller 217 can generate a command and/or commands to accelerate the speed of the vehicle to reach the higher speed limit. However, the data received by the application controller 217 and used to generate the command to accelerate the vehicle could be corrupted, which could mean the vehicle when executing the command is accelerating even though the speed limit did not change and/or the speed limit is different than what is indicated to the application controller 217 by the corrupted data.

In some embodiments, the safety controller 218 can prevent a command from being executed via data path 234 by the vehicle. The safety controller 218 can prevent a command from being executed by generating a response and/or transmitting a flag to the MUX 236 and the application controller 217 via communication path 228. The safety controller 218 can transmit a flag in response to identifying a difference between the data from the memory device 214 and the latched data from the application controller 217. In some embodiments, the safety controller 218 can compare the reverse output and direct output from the memory device 214 and the output from the application controller 217. If one and/or more of the data outputs are different, the safety controller 218 can transmit a flag. The data outputs being different (e.g., different than the direct output from the memory device 214 and the latched data from the application controller 217 matching and being the opposite of the reverse output from the memory device 214) can indicate that at least one of the data outputs have been corrupted while stored and/or transmitted.

The memory device 214 and/or the application controller 217 can transmit another portion of data in response to the application controller 217 receiving the flag via communication path 228 from the safety controller 218. The flag can indicate that the data outputs from the memory device 214 and/or the application controller 217 are corrupt and that the data needs to be resent.

In some embodiments, the application controller 217 can output a safety acknowledgment signal via communication path 230 to the safety controller 218. The safety acknowledgment signal can be sent in response to receiving the flag from the safety controller 218. The acknowledgment signal can notify the safety controller 218 that the application controller 217 received the flag and/or the application controller 217 and/or the memory device 214 are resending the data.

In response to receiving the safety acknowledgment signal from the application controller 217, the safety controller 218 can remove the flag. In the absence of a flag and/or if a response is not generated, the MUX 236 will allow the application controller 217 commands to be executed by the vehicle via data path 234.

The safety controller 218 can allow commands from the application controller 217 to be executed in response to identifying a match between the data from the memory resource 214 and the latched data from the application controller 217. For example, commands can be executed if the direct output data from the memory device 214 and the output data from the application controller 217 match and are the opposite of the reverse output data from the memory device 214. Also, the reverse output data can be put in a direct output data state once received by the safety controller 218, and compared against the other output data. Commands can be executed if the direct output data from the memory device 214 and the output data from the application controller 217 match and are the opposite of the reverse output data from the memory device 214.

Figure 3:
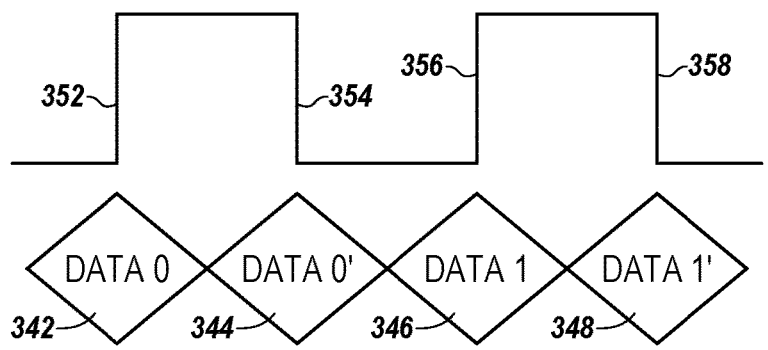
FIG. 3 is a diagram of a memory output of a double edge device in accordance with a number of embodiments of the present disclosure.

FIG. 3 is a diagram of a memory output of a double edge device in accordance with a number of embodiments of the present disclosure. A double edge device is a memory device (e.g., memory device 214 in FIG. 2). As shown in FIG. 3, data can be transmitted on rising edges 352 and 356 and falling edges 354 and 358 of a double edge device. For example, Data 0 at 342 can be transmitted on rising edge 352. Data 0 can be a direct output from memory because it is transmitted on a rising edge 352. Data 0' at 344 can be a reverse output because it is transmitted on a falling edge 354. Reverse output meaning that Data 0' is identical but reverse (e.g., opposite) of Data 0. Data 1 at 346 can be transmitted as a direct output on rising edge 356 and Data 1' at 348 can be transmitted as a reverse output of Data 1 on the falling edge 358.

The direct output from the memory device (e.g., memory device 214 in FIG. 2) can be represented by Data 0 at 342 being transmitted on the rising edge 352. The reverse output from the memory device can be represented by Data 0' at 344 being transmitted on the falling edge 354. The application controller (e.g., application controller 217 in FIG. 2) latching data from the memory device can be represented by Data 1 at 346 being latched on the rising edge 356. The reverse output from the application controller can be represented by Data 1' at 348 being transmitted on the falling edge 358.

The direct output from memory device (e.g., memory device 214 in FIG. 2) transmitted on the rising edge 352, the reverse output from the memory device transmitted on the falling edge 354, and the output from the application controller (e.g., application controller 217 in FIG. 2) transmitted on the falling edge 358 can be received by a safety controller (e.g., safety controller 218 in FIG. 2). The safety controller may allow commands to be outputted from the application controller in response to identifying a match between the data from the memory device and the latched data from the application controller.

The memory device (e.g., memory device 214 in FIG. 2) can be programmed as a double edge device such that the direct data is programmed on every other row of the memory device and the reverse data is programmed adjacent to the corresponding direct data. For example, the direct data can be programmed on even addresses and the reverse data can be programmed on odd addresses so that the direct data is transmitted on the rising edge 352 and the reverse data is transmitted on the falling edge 354.

Figure 4:
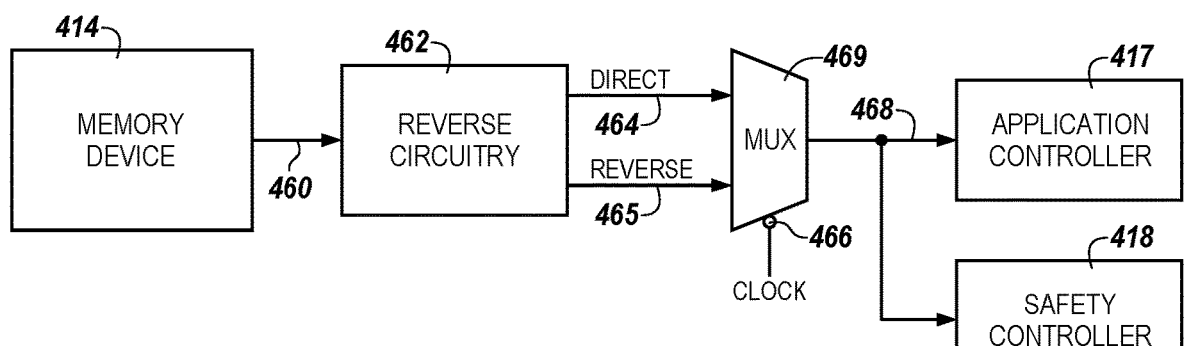
FIG. 4 is a flow diagram including reverse circuitry outputting data in accordance with a number of embodiments of the present disclosure.

FIG. 4 is a flow diagram including reverse circuitry outputting data in accordance with a number of embodiments of the present disclosure. The reverse circuitry as shown in FIG. 4 can be used to reverse the pattern of the data from the memory device 414. The data can be autonomous vehicle data. For example, the data can include photographic data collected from vehicle cameras, and/or data collected from vehicle sensors, but the data is not limited to photographic data or vehicle sensor data.

The memory device 414 can store and transmit data. The memory device 414 can be coupled to reverse circuitry 462. The memory device 414 can transmit data 460 to the reverse circuitry. The data transmitted by the memory device 414 can be transmitted on a rising edge of a clock and can be a direct output.

The reverse circuitry 462 can receive the data as a direct output from the memory device 414. The reverse circuitry 462 can copy the direct output and reverse the direct output pattern to create a reverse output. The reverse circuitry 462 can transmit the direct output 464 from the memory device 414 and the reverse output 465 to a multiplexer 469 (e.g., MUX).

The MUX 469 can combine signals. The MUX 469 can combine the direct output 464 and the reverse output 465 into one signal. The MUX 469 can include a clock 466. The clock 466 can be used to initiate the sending of the second signal to ensure both signals are sent in one signal. For example, the direct output 464 can be transmitted on a rising edge (e.g., rising edge 352 in FIG. 3) to the application controller 417 and the safety controller 418 until the clock initiates the sending of the reverse output on a falling edge (e.g., falling edge 354 in FIG. 3) to the application controller 417 and the safety controller 418.

The combined signal 468 can be received by the application controller 417. The application controller 417 can latch the data of the combined signal 468. The data can be latched on a rising edge (e.g., rising edge 356 in FIG. 3). The latched data can be transmitted to the safety controller. The latched data can be transmitted as an output sent on a falling edge (e.g., falling edge 358 in FIG. 3) of a signal.

The combined signal 468 can also be received by the safety controller 418. The safety controller 418 can determine whether to allow an output of commands from the application controller 417 in response to a comparison of the data from the memory device 414 and the latched data from the application controller 417. For example, the safety controller 418 can compare the direct output and the reverse output from the memory device 414 and the reverse output from the application controller 417

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a memory resource configured to:
     store data; and
     transmit the data;
   a safety controller coupled to the memory resource, wherein the safety controller implements safety measures in applications and is configured to:
     receive the data from the memory resource;
     receive latched data from an application controller; and
     determine to allow an output of commands from the application controller in response to a comparison of the data from the memory resource and the latched data from the application controller; and
   a multiplexor (MUX) coupled to the application controller and the safety controller, wherein the MUX is configured to allow the output of the commands from the application controller in response to the safety controller determining to allow the output of the commands.

2. The apparatus of claim 1, wherein the data is autonomous vehicle data.

3. The apparatus of claim 1, wherein the memory resource is a NOR device.

4. The apparatus of claim 1, wherein the memory resource is a double edge device.

5. The apparatus of claim 1, wherein the data is received by the application controller as a direct output and the data is received by the safety controller as a reverse output.

6. The apparatus of claim 5, wherein the direct output is transmitted by the memory resource on a rising edge of a clock and the reverse output is transmitted by the memory resource on a falling edge of the clock.

7. The apparatus of claim 6, wherein the direct output is programmed on every other row of the memory resource and the reverse output is programmed adjacent to the corresponding direct output.

8. The apparatus of claim 7, wherein the latched data is transmitted on a falling edge of the clock.

9. The apparatus of claim 1, wherein the application controller latches the data in response to receiving the data from the memory resource.

10. An apparatus, comprising:
    a memory resource configured to:
      store data; and
      transmit the data;
    a safety controller coupled to the memory resource, wherein the safety controller is configured to:
      receive the data from the memory resource;
      receive latched data from an application controller; and
      determine to allow an output of commands from the application controller in response to identifying a match between the data from the memory resource and the latched data from the application controller; and
    a multiplexor (MUX) coupled to the application controller and the safety controller, wherein the MUX is configured to allow the output of the commands from the application controller in response to the safety controller determining to allow the output of the commands from the application controller.

11. The apparatus of claim 10, wherein the application controller receives the data from the memory resource.

12. The apparatus of claim 10, wherein the application controller outputs the commands that are associated with data from the memory resource.

13. The apparatus of claim 10, wherein the application controller outputs the commands in response to receiving data from the memory resource.

14. The apparatus of claim 10, wherein the data includes data collected from vehicle sensors, photographic data collected from vehicle cameras, or combinations thereof.

15. A method, comprising:
    receiving data from a memory resource;
    receiving latched data from an application controller;
    determining to allow an output of commands from the application controller in response to a comparison of the data from the memory resource and the latched data from the application controller at the safety controller; and
    a multiplexor (MUX) allowing the output of the commands from the application controller in response to the safety controller determining to allow the output of the commands.

16. The method of claim 15, further includes transmitting the data from the memory resource as a direct output to the safety controller.

17. The method of claim 15, wherein the data from the memory resource to the safety controller is transmitted on a rising edge of a clock.

18. The method of claim 15, further includes transmitting the data from the memory resource to the application controller as a direct output.

19. The method of claim 18, wherein the direct output is transmitted on a rising edge of a clock.

20. The method of claim 15, further includes the application controller latching the data in response to receiving the data from the memory resource.

21. The method of claim 15, wherein the data is autonomous vehicle data.

22. The method of claim 15, further including the application controller outputting a safety acknowledgment signal to the safety controller in response to receiving a flag from the safety controller.

23. A method, comprising:
    receiving data from a memory resource;
    receiving latched data from an application controller;
    comparing the data from the memory resource and the latched data from the application controller and fail to generate a response to an output from the application controller at a safety controller in response to the comparison of the data from the memory resource and the latched data from the application controller; and
    allowing the command to be outputted by the application controller at a multiplexor (MUX) in response to the safety controller failing to generate the response.

24. The method of claim 23, further including the application controller receiving the data from the memory resource and latching the data.

25. The method of claim 23, further including the application controller outputting the commands associated with the latched data in response to receiving data from the memory resource.

* * * * *